US006927646B2

United States Patent
Niemi

(10) Patent No.: US 6,927,646 B2
(45) Date of Patent: Aug. 9, 2005

(54) BYPASS ARRANGEMENT FOR LOW-NOISE AMPLIFIER

(75) Inventor: Mika Niemi, Kempele (FI)

(73) Assignee: Filtronic LK Oy, Kempele (FI)

( * ) Notice: Subject to any disclaimer, the term of this patent is extended or adjusted under 35 U.S.C. 154(b) by 67 days.

(21) Appl. No.: 10/617,898

(22) Filed: Jul. 10, 2003

(65) Prior Publication Data

US 2004/0008094 A1 Jan. 15, 2004

(30) Foreign Application Priority Data

Jul. 12, 2002 (FI) ............................................. 20021373

(51) Int. Cl.$^7$ ................................................. H01P 1/10
(52) U.S. Cl. .................... 333/101; 333/203; 455/232.1
(58) Field of Search ................................ 333/101, 203; 455/232.1, 250.1, 245.1, 179.1

(56) References Cited

U.S. PATENT DOCUMENTS 6,724,278 B1 * 4/2004 Smith ......................... 333/133

FOREIGN PATENT DOCUMENTS

| WO | WO 99/29047 A1 | 6/1999 |
| WO | WO 02/13402 A2 | 2/2002 |
| WO | WO 02/47251 A2 | 6/2002 |

\* cited by examiner

Primary Examiner—Anh Q. Tran
(74) Attorney, Agent, or Firm—Darby & Darby

(57) ABSTRACT

An arrangement for bypassing a low-noise amplifier (LNA), intended especially to be used in base stations of mobile networks. For the bypass, a receiver antenna filter (210) has a second output (OUT2) parallel with a first output (OUT1) connected to the LNA. The antenna filter is of the resonator type, and there is a conductive element for each of its outputs in the resonator cavity. Selection between the LNA out-put signal and signal coming direct from the antenna filter is made by a changeover switch (SW). The noise figure of the receiver front stage (220) will improve as the series switch on the signal path, which most degrades the noise figure, is removed between the filter and LNA, and isolation on the LNA bypass path increases.

12 Claims, 2 Drawing Sheets

BYPASS ARRANGEMENT FOR LOW-NOISE AMPLIFIER

The invention relates to an arrangement for bypassing a low-noise amplifier in a radio receiver. The arrangement finds particular utility in base stations of mobile communication networks.

BACKGROUND OF THE INVENTION

In all radio receivers, the first amplifier on the path from the antenna into the receiver should have very low noise characteristics, for the signal level at the input of this amplifier is low and additional noise caused by the amplifier will be amplified in all amplifier stages to follow. A low-noise first amplifier is usually abbreviated LNA. In receivers of mobile network base stations the maximum allowable noise figure specified for the LNA is typically 1.8 dB. This is a relatively strict requirement especially considering that the figure includes the increase in the noise figure caused by a circuit arrangement enabling bypassing of the LNA. The LNA needs to be bypassed because of certain base station maintenance measurements and in LNA fault conditions.

FIG. 1 is a block diagram illustrating the front end of a typical RF receiver, and a known arrangement of bypassing the LNA. FIG. 1 shows an antenna ANT and from there on, on the receiver's signal path, an antenna filter 110, a first switch SW1, low-noise amplifier LNA, second switch SW2, bandpass filter BPF, and a mixer MIX. The mixer gives an intermediate-frequency signal for further processing. Switches SW1 and SW2 are changeover switches having a common control C. When the switches are in position 1, the output signal from the antenna filter 110 is guided via switch SW1 to the LNA input, and the LNA output signal via switch SW2 towards the intermediate-frequency part. With the switches in position 2, the output signal from the antenna filter 110 is guided via switch SW1 to switch SW2 and from there on towards the intermediate-frequency part. The LNA is thus bypassed. In this patent application the receiver part 120 comprised of the LNA and its bypass arrangement is called a front stage.

The first and second switches SW1, SW2 may be implemented by PIN diodes, MMIC (Microwave Monolithic Integrated Circuit) components, MEMS (Micro-Electro-Mechanical System) switches or relays, for example. Attenuation in a signal caused by a single switch is on the order of 0.25 dB. Attenuation in the switch in front of the LNA increases the noise figure of the front stage in the same proportion; at the output side of the LNA the influence of the switch on the noise figure is smaller. Another disadvantage caused by the switches is that in the normal operating mode of the receiver the isolation on the LNA bypass path is finite, not infinite. This, too, degrades the front stage noise figure. Switches can be designed so as to have a very high isolation, but then, in practice, they induce greater losses.

SUMMARY OF THE INVENTION

An object of the invention is to reduce said disadvantages related to the prior art. A structure according to the invention is characterized in that which is specified in the independent claim 1. Some preferred embodiments of the invention are specified in the other claims.

The basic idea of the invention is as follows: An antenna filter in a receiver is arranged to a second output for bypassing a low-noise amplifier LNA, which output is in parallel with a first output connected to the LNA. The antenna filter is of the resonator type, and for both outputs there is a conductive element of their own in the resonator cavity. Selection between the LNA output signal and signal coming direct from the antenna filter is made using a changeover switch.

An advantage of the invention is that the noise figure of the receiver front stage will be improved. This is a result of the fact that, first, the series switch on the signal path, which most degrades the noise figure, is removed between the filter and the LNA and, second, isolation on the LNA bypass path increases. Another advantage of the invention is that the arrangement according to it only simplifies the structure of the front stage.

BRIEF DESCRIPTION OF THE DRAWINGS

The invention will now be described in detail. Reference will be made to the accompanying drawings wherein.

DETAILED DESCRIPTION OF THE INVENTION

Figure 1:
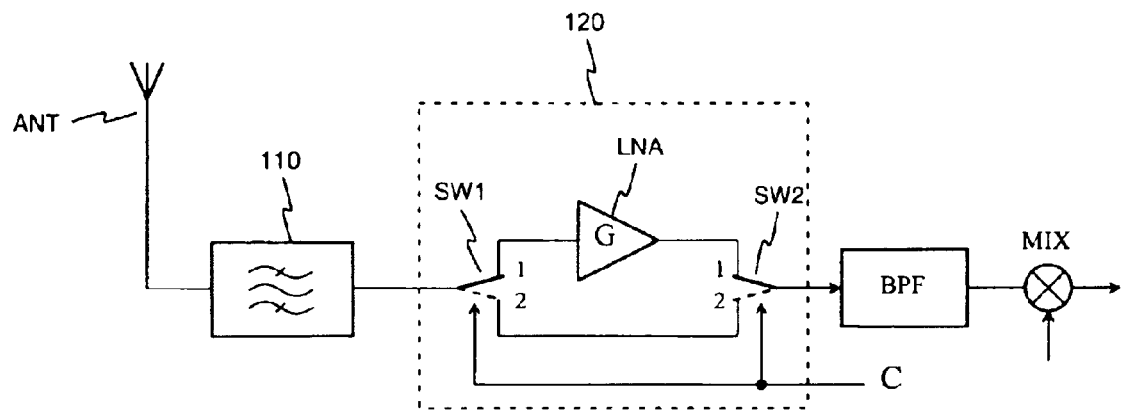
FIG. 1 shows the principle of the LNA bypass arrangement according to the prior-art.

FIG. 1 was already discussed in connection with the description of the prior art.

Figure 2:
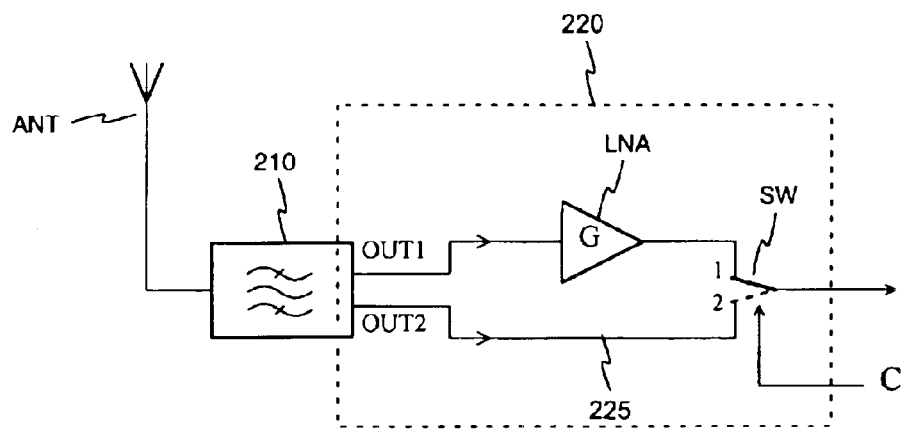
FIG. 2 shows an example of a LNA bypass arrangement according to the invention.

FIG. 2 is a block diagram illustrating the principle of the LNA bypass arrangement according to the invention. FIG. 2 shows an antenna ANT connected to receiver's antenna filter 210. In accordance with the invention the antenna filter has two parallel outputs: a first output OUT1 and a second output OUT2. The first output is connected direct to the input of a low-noise amplifier LNA, and the second output is connected direct to the LNA bypass path 225. Here and in the claims the phrase "connected direct" refers to a connection between circuit portions that cannot be changed by electric control. Next on the signal path there is a changeover switch SW, like the changeover switch SW2 in FIG. 1. The output of the LNA is connected to a first changeover terminal in the changeover switch SW, and the bypass path 225 is connected to a second changeover terminal of the changeover switch SW. By means of a control signal C it is possible to select the changeover terminal that will be connected to the output terminal of the changeover switch SW, i.e. to select whether or not the LNA will be bypassed.

In FIG. 2 the front stage 220 of the receiver comprises the output stage of the antenna filter 210, the LNA with its bypass path, and the switch SW. The parallel outputs of the antenna filter replace the first changeover switch SW1 of FIG. 1. The disadvantages caused by this switch are at the same time eliminated.

Figure 3:
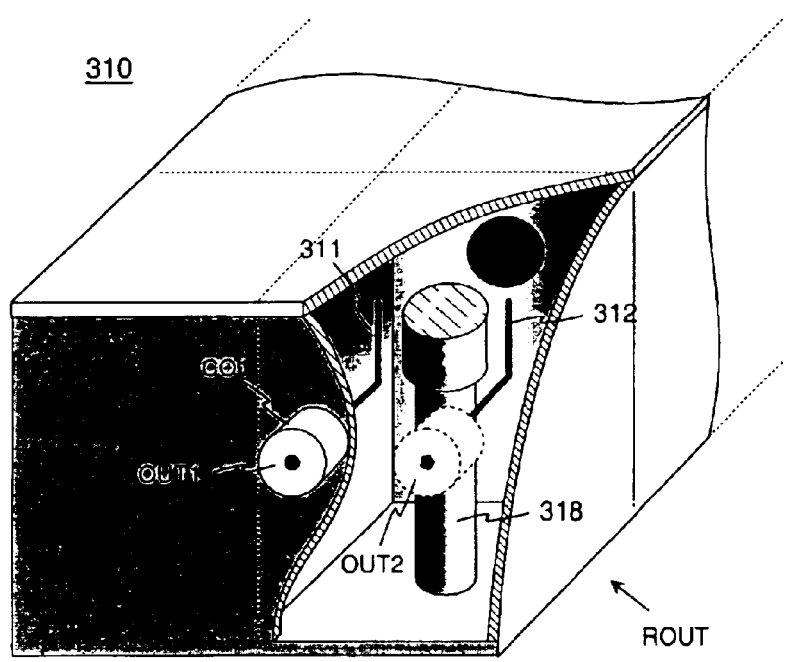
FIG. 3 shows an example of an antenna filter output stage according to the invention.

FIG. 3 shows an example of a receiver's antenna filter output stage according to the invention. An antenna filter 310 comprises air-insulated coaxial resonators connected in series, where the outer walls of the resonators constitute a conductive metal casing. The last resonator ROUT in the series, which provides the output signal, is shown cut open in the drawing. At the center of the resonator there is seen the inner conductor 318 the lower end of which is in galvanic contact with the resonator bottom whereby the resonator is short-circuited at its lower end. At its upper end the resonator is electrically open in this example. The structure is thus a quarter-wave resonator in which the electric field is relatively strong at the upper side of the cavity and the magnetic field is relatively strong at the lower side of the cavity.

For taking out the energy of the signal, there is a conductive element 311 at the upper part of the resonator cavity in the example depicted in FIG. 3. This element is connected to the inner conductor of a first connector CO1. The outer conductor of the first connector is in galvanic contact with the filter casing and thereby with signal ground. Connector CO1 represents the first output OUT1 of the filter 310, and it is connected to the LNA. At the upper part of the resonator cavity there is additionally a second conductive element 312 connected to a second connector, depicted in broken line in the drawing. This second connector represents the second output OUT2 of the filter 310, and it is connected to the LNA bypass path. The conductive elements 311 and 312 can be placed in the resonator cavity such that they give output signals of the same level. In normal operation of the receiver, the signal provided by the LNA is used. At that time, the signal path from the second output OUT2 to the LNA bypass path has a very high impedance and does not load the feeding source, i.e. the antenna.

In FIG. 3, the conductive elements 311, 312 are located in the upper part of the resonator cavity so that their coupling is mainly capacitive. The conductive elements may also be placed lower so that the coupling will be both capacitive and inductive or almost purely inductive. Galvanic coupling to the inner conductor 318 may also be used. Instead of being quarter-wave, the resonators may also be half-wave resonators, in which case they are short-circuited at both ends, or they may even be plain cavity resonators.

Figure 4:
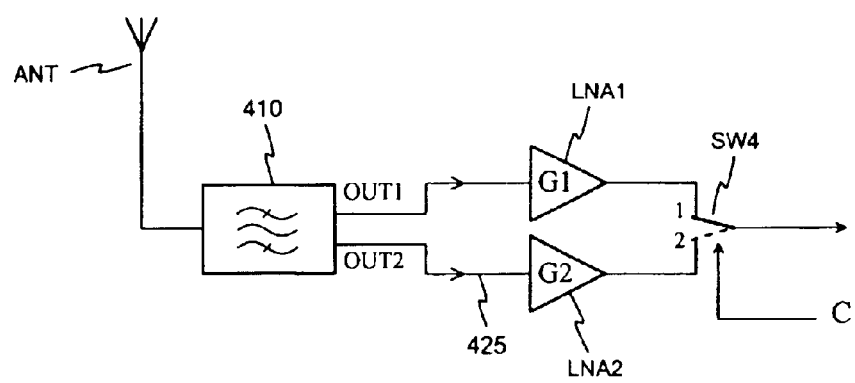
FIG. 4 shows a second example of a LNA bypass arrangement according to the invention.

FIG. 4 shows a second example of a LNA bypass arrangement according to the invention. FIG. 4 shows an antenna ANT, receiver antenna filter 410 with two outputs, first low-noise amplifier LNA1, and a changeover switch SW4, like the corresponding parts in FIG. 2. The difference with respect to FIG. 2 is that the bypass path 425 is not just a conductor connection but there is a second low-noise amplifier LNA2 on the path. This may be a spare amplifier taken into use by means of switch SW4 if the amplifier LNA1 becomes faulty. The gains G1 and G2 of the first and second low-noise amplifiers, respectively, may also be different, in which case switch SW4 is used to select the suitable amplifier in a given situation. In this case, too, it is achieved the advantage according to the invention that the degradation of the noise figure caused by one switch is eliminated.

Examples of the arrangement according to the invention were described above. The invention is not limited to those examples but, for instance, in the case of two amplifiers, the antenna filter may have a third output for bypassing the both amplifiers. The inventional idea can be applied in different ways within the scope defined by the independent claim 1.

What is claimed is:

1. An arrangement for bypassing a low-noise amplifier in a radio receiver which comprises an antenna filter between said amplifier and an antenna, and a bypass path for said amplifier, the arrangement comprising;

at an output side of said amplifier, a changeover switch for selecting a signal to be led along a signal path either from said amplifier or from the bypass path;

said antenna filter is a resonator-type filter with an output resonator cavity having at least two parallel outputs, a first output coupled direct to an input of said amplifier and a second output coupled direct to said bypass path.

2. The arrangement according to claim 1, wherein each of said parallel outputs has a conductive element in the output resonator cavity that conducts signal energy out of the filter.

3. The arrangement according to claim 2, said conductive elements having substantially equally strong electromagnetic coupling to the output resonator.

4. An arrangement for bypassing a low-noise amplifier in a radio receiver which comprises an antenna filter between said amplifier and an antenna, and a bypass path for said amplifier, the arrangement comprising;

at an output side of said amplifier, a changeover switch for selecting a signal to be led along a signal path either from said amplifier or from the bypass path, said antenna filter having at least two parallel outputs, a first of which is coupled direct to an input of said amplifier, and a second of which is coupled direct to said bypass path; and the bypass path being a galvanic conductor connection.

5. The arrangement according to claim 1, comprising a second low-noise amplifier on the bypass path.

6. The arrangement according to claim 1, the changeover switch being implemented by PIN diodes.

7. The arrangement according to claim 1, the changeover switch being implemented by MEMS switches.

8. The arrangement according to claim 1, the changeover switch being implemented by MMIC technology.

9. The arrangement according to claim 1, the changeover switch being implemented by a relay.

10. The arrangement according to claim 1, the bypass path being a galvanic conductor connection.

11. The arrangement according to claim 1, wherein the resonator-type filter is one of a quarter-wave resonator, a half-wave resonator, and a plain cavity resonator.

12. The arrangement according to claim 2, wherein said conductive elements are coupled to the respective outputs capacitively, inductively, or both capacitively and inductively.

* * * * *